(12) United States Patent
Hirochi et al.

(10) Patent No.: US 11,018,033 B2
(45) Date of Patent: May 25, 2021

(54) SUBSTRATE PROCESSING APPARATUS, METHOD OF MANUFACTURING SEMICONDUCTOR DEVICE, AND RECORDING MEDIUM

(71) Applicant: KOKUSAI ELECTRIC CORPORATION, Tokyo (JP)

(72) Inventors: Yukitomo Hirochi, Toyama (JP); Kazuhiro Yuasa, Toyama (JP); Tetsuo Yamamoto, Toyama (JP); Yoshihiko Yanagisawa, Toyama (JP); Shinya Sasaki, Toyama (JP); Noriaki Michita, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/563,466

(22) Filed: Sep. 6, 2019

(65) Prior Publication Data
US 2019/0393056 A1  Dec. 26, 2019

Related U.S. Application Data

(63) Continuation of application No. PCT/JP2017/010220, filed on Mar. 14, 2017.

(51) Int. Cl.
*H01L 21/00* (2006.01)
*H01L 21/67* (2006.01)
(Continued)

(52) U.S. Cl.
CPC ...... *H01L 21/67115* (2013.01); *H01L 21/324* (2013.01); *H01L 21/67196* (2013.01); *H01L 21/67766* (2013.01)

(58) Field of Classification Search
None
See application file for complete search history.

(56) References Cited

U.S. PATENT DOCUMENTS

2018/0148834 A1  5/2018  Kamimura et al.

FOREIGN PATENT DOCUMENTS

| JP | 09-106956 A | 4/1997 |
|---|---|---|
| JP | 2003-092329 A | 3/2003 |

(Continued)

OTHER PUBLICATIONS

International Search Report, PCT/JP2017/010220, dated Jun. 6, 2017, 2 pgs.
(Continued)

*Primary Examiner* — Reema Patel
(74) *Attorney, Agent, or Firm* — Volpe Koenig

(57) ABSTRACT

There is provided a technique that includes a process chamber including a gate valve that opens and closes a loading and unloading port configured to load and unload a substrate, and configured to heat and process the substrate by a heater using a microwave; a substrate transfer chamber including a purge gas distribution mechanism configured to distribute a purge gas supplied from a clean unit capable of introducing the purge gas; a transfer machine installed inside the substrate transfer chamber and configured to transfer the substrate into the process chamber; and a substrate cooling mounting tool configured to cool the substrate transferred from the process chamber by the transfer machine.

12 Claims, 12 Drawing Sheets

(51) Int. Cl.
*H01L 21/324* (2006.01)
*H01L 21/677* (2006.01)

(56) References Cited

FOREIGN PATENT DOCUMENTS

| | | | |
|---|---|---|---|
| JP | 2005-175068 A | 6/2005 | |
| JP | 2005-268244 A | 9/2005 | |
| WO | 2012/133441 A1 | 10/2012 | |
| WO | WO-2012133441 A1 * | 10/2012 | ....... H01L 21/67109 |
| WO | 2017/022366 A1 | 2/2017 | |
| WO | WO-2017022366 A1 * | 2/2017 | ....... C23C 16/45591 |

OTHER PUBLICATIONS

Japanese Office Action dated Oct. 6, 2020 for Japanese Patent Application No. 2019-505563.
Korean Office Action dated Nov. 9, 2020 for Korean Patent Application No. 10-2019-7026382.

* cited by examiner

100

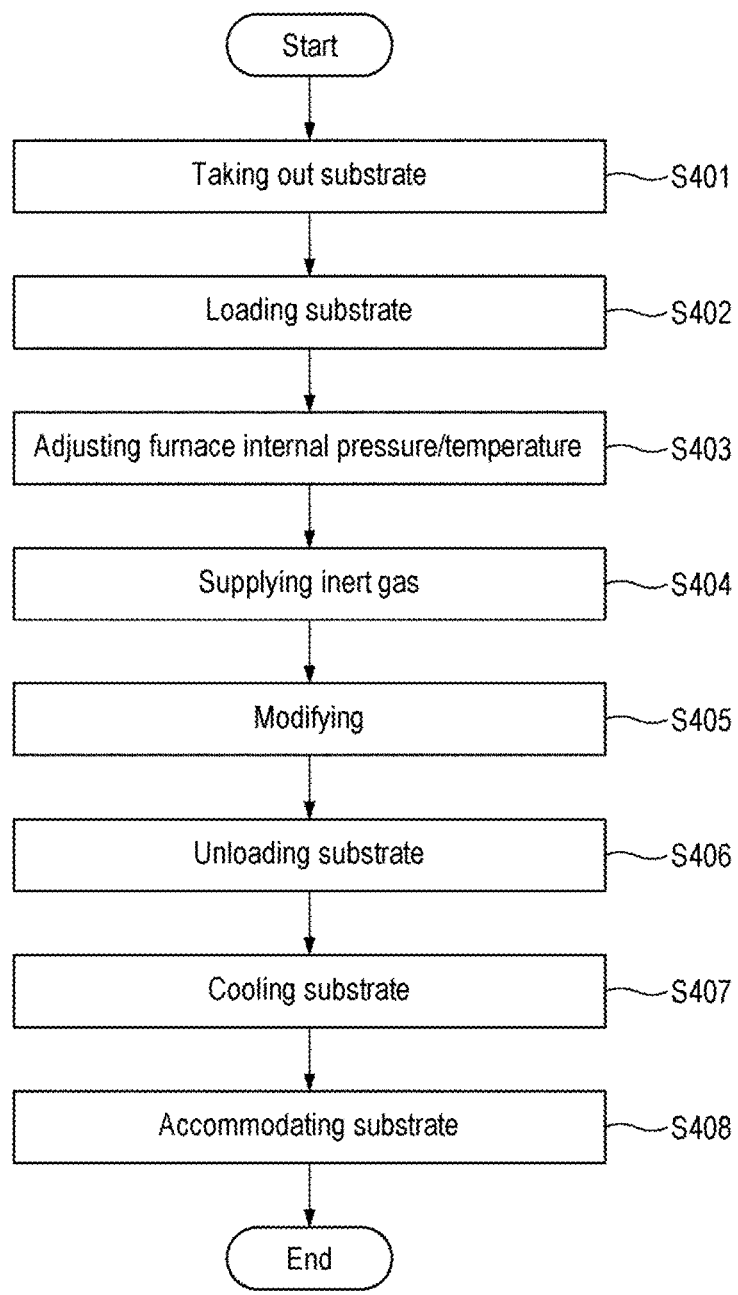

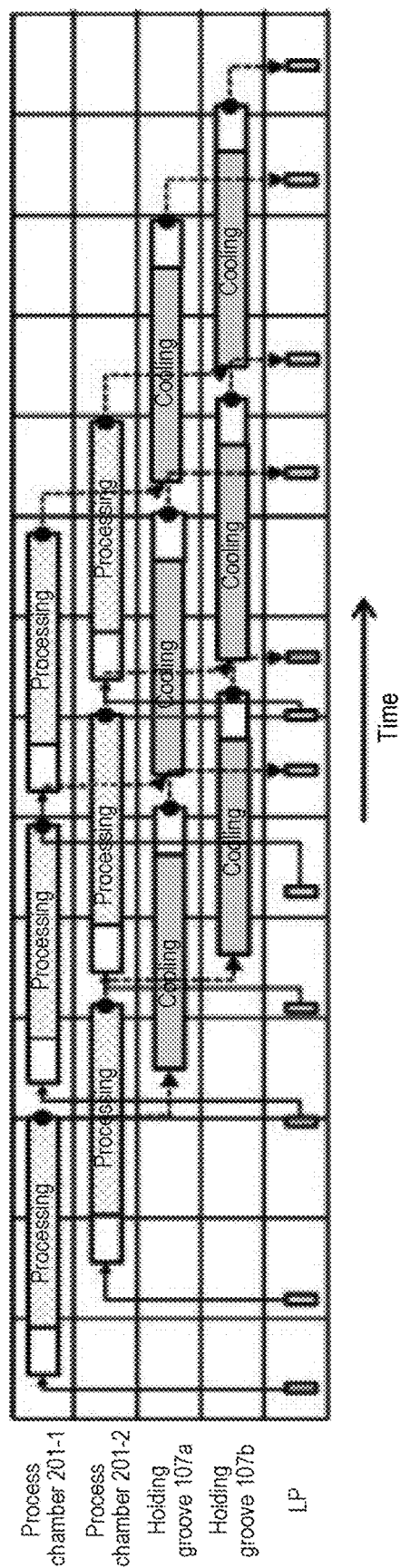

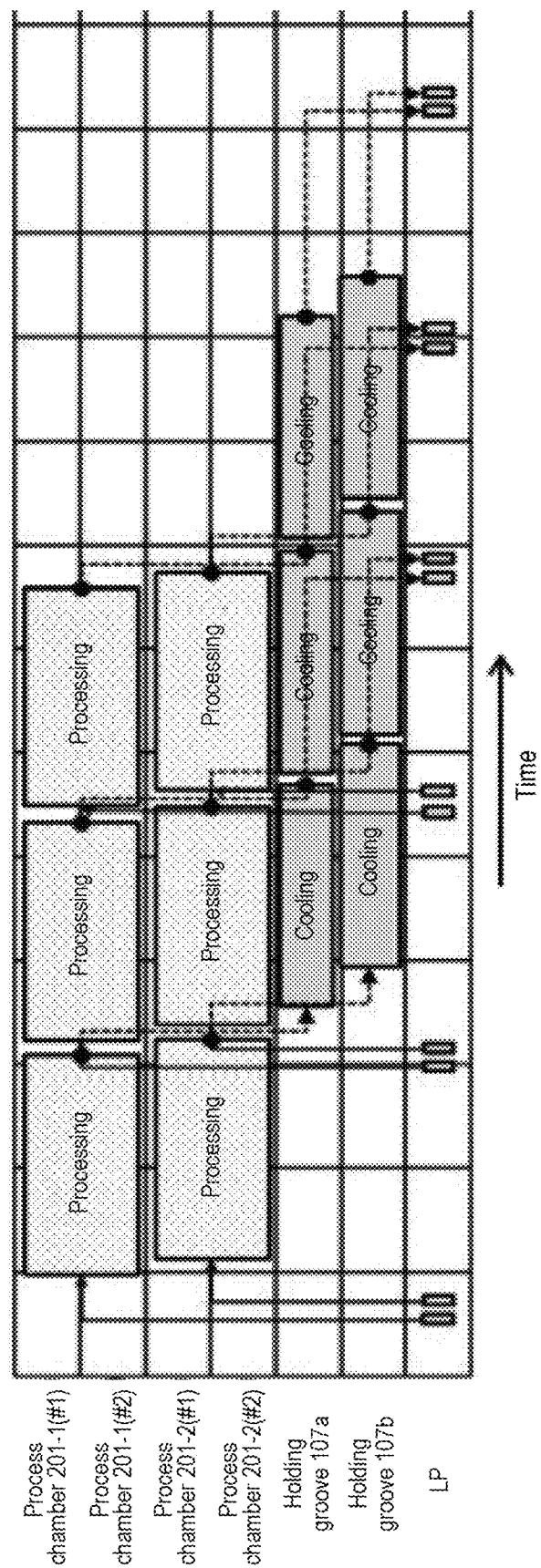

SUBSTRATE PROCESSING APPARATUS, METHOD OF MANUFACTURING SEMICONDUCTOR DEVICE, AND RECORDING MEDIUM

CROSS-REFERENCE TO RELATED APPLICATION

This application is a Bypass Continuation Application of PCT International Application No. PCT/JP2017/010220, filed Mar. 14, 2017, the disclosure of which is incorporated herein in its entirety by reference.

TECHNICAL FIELD

The present disclosure relates to a substrate processing apparatus, a method of manufacturing a semiconductor device, and a recording medium.

BACKGROUND

As a process of manufacturing a semiconductor device, for example, there is a modifying process, which is typified by an annealing process, for heating a substrate in a process chamber using a heating device to change a composition or a crystal structure in a thin film formed on a surface of the substrate or repair crystal defects and the like in the formed thin film. In recent semiconductor devices, miniaturization and high integration have become remarkable, and in conjunction with this, there is a demand for a process of modifying a high density substrate on which patterns having a high aspect ratio are formed. A heat treatment method using an electromagnetic wave has been studied as a method for modifying such a high density substrate.

In a known process using the electromagnetic wave, it is necessary to provide a cooling process of cooling a substrate heated to a high temperature by heat treatment in a process chamber, which may result in low productivity.

SUMMARY

Some embodiments of the present disclosure provide an electromagnetic wave processing technique capable of suppressing a decrease in productivity even when a substrate cooling process is provided.

According to some embodiments of the present disclosure, there is provided a technique that includes a process chamber including a gate valve that opens and closes a loading and unloading port configured to load and unload a substrate, and configured to heat and process the substrate by a heater using a microwave; a substrate transfer chamber including a purge gas distribution mechanism configured to distribute a purge gas supplied from a clean unit capable of introducing the purge gas; a transfer machine installed inside the substrate transfer chamber and configured to transfer the substrate into the process chamber; and a substrate cooling mounting tool configured to cool the substrate transferred from the process chamber by the transfer machine.

BRIEF DESCRIPTION OF DRAWINGS

FIG. 6 is a flowchart showing a flow of substrate processing in the present disclosure.

FIG. 8A is a view showing an example of a substrate processing sequence in a case of processing one wafer for each process chamber.

FIG. 8B is a view showing an example of the substrate processing sequence in a case of processing two wafers for each process chamber.

DETAILED DESCRIPTION

One Embodiment of the Present Disclosure

One embodiment of the present disclosure will be described below with reference to the drawings.

(1) Configuration of Substrate Processing Apparatus

A substrate processing apparatus 100 according to one embodiment of the present disclosure is configured as a single-wafer type heat treatment apparatus that performs various kinds of heat treatments on a wafer, and will be described with an apparatus that performs an annealing process (modifying process) using an electromagnetic wave to be described later. The substrate processing apparatus 100 according to the present embodiment includes a FOUP (Front Opening Unified Pod: hereinafter referred to as a pod) 110 used as a storage container (carrier) in which a wafer 200 as a substrate is accommodated. The pod 110 is also used as a transfer container for transferring the wafer 200 between various substrate processing apparatuses.

Figure 1:
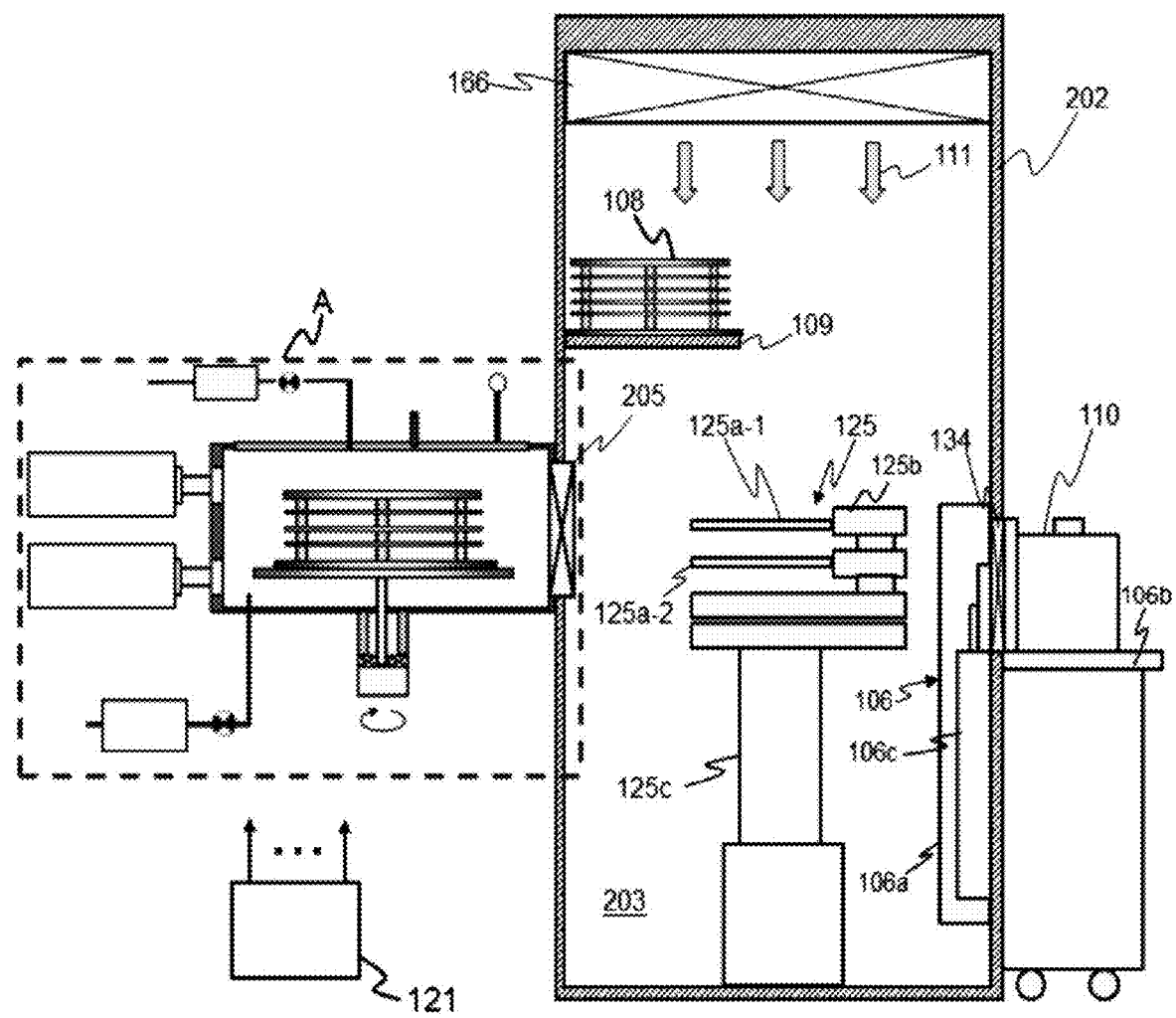
FIG. 1 is a longitudinal sectional view showing a schematic configuration of a substrate processing apparatus suitably used in an embodiment of the present disclosure.
Figure 2:
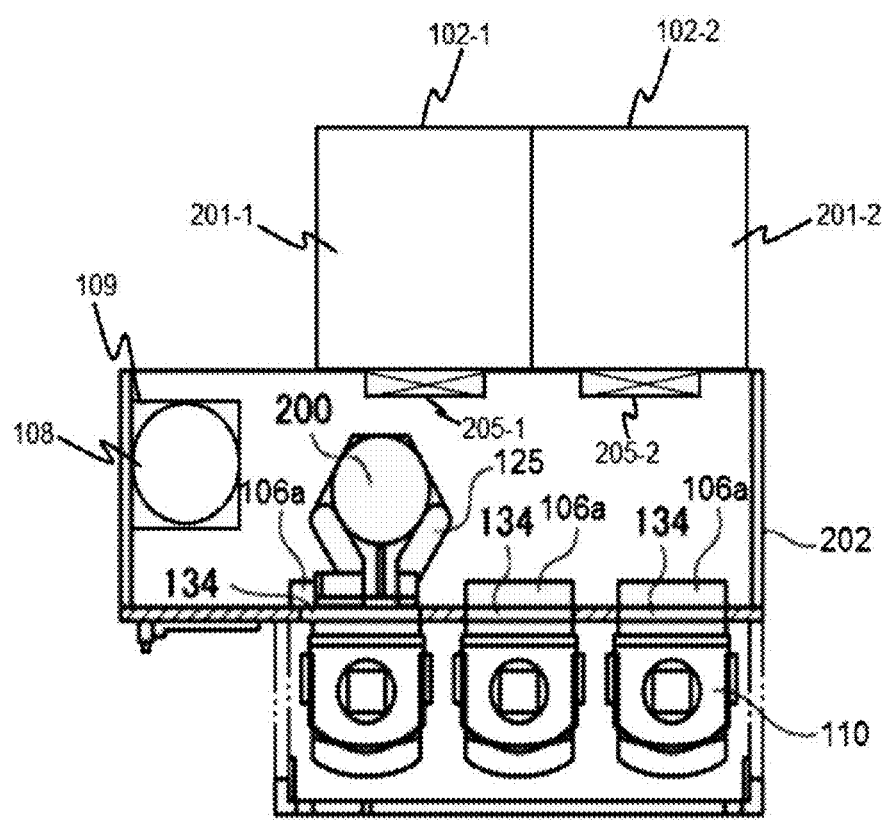
FIG. 2 is a cross-sectional view showing a schematic configuration of the substrate processing apparatus suitably used in the embodiment of the present disclosure.

As shown in FIGS. 1 and 2, the substrate processing apparatus 100 includes a transfer housing 202 in which a transfer chamber (transfer area) 203 for transferring the wafer 200 is provided, and cases 102-1 and 102-2 as process containers to be described later, which are provided on the side wall of the transfer housing 202 and contain process chambers 201-1 and 201-2 for processing the wafer 200, respectively. A load port unit (LP) 106 as an opening and closing mechanism for opening and closing a lid of the pod 110 to load and unload the wafer 200 into and from the transfer chamber 203 is disposed in the right side in FIG. 1 (lower side in FIG. 2) which is the front side of the housing of the transfer chamber 203. The load port unit 106 includes a housing 106a, a stage 106b and an opener 106c. The stage 106b mounts the pod 110 and is configured to bring the pod 110 in proximity to a substrate loading/unloading port 134 formed in front of the housing of the transfer chamber 203. The opener 106c opens and closes a lid (not shown) provided at the pod 110. The load port unit 106 may also have a function capable of purging the interior of the pod 110 with a purge gas such as a $N_2$ gas. The housing 202 has a purge gas circulation structure, which will be described later, as a purge gas distribution mechanism that circulates a purge gas such as a $N_2$ gas in the transfer chamber 203.

Gate valves 205-1 and 205-2 for opening and closing the process chambers 201-1 and 202-2 respectively are disposed in the left side in FIG. 1 (upper side in FIG. 2) that is the rear side of the housing of the transfer chamber 203. A transfer machine 125 as a substrate transfer mechanism (substrate transfer robot) for transferring the wafer 200 is installed in the transfer chamber 203. The transfer machine 125 includes tweezers (arms) 125a-1 and 125a-2 as a mounting part on which the wafer 200 is mounted, a transfer device 125b that can horizontally rotate or linearly move each of the tweezers 125a-1 and 125a-2, and a transfer device elevator 125c that raises and lowers the transfer device 125b. The wafer 200 can be loaded (charged) onto or unloaded (discharged) from a substrate holder 217 to be described later or the pod 110 by the continuous operation of the tweezers 125a-1 and 125a-2, the transfer device 125b and the transfer device elevator 125c. Hereinafter, unless it is necessary to distinguish between them, the cases 102-1 and 102-2, the process chambers 201-1 and 201-2 and the tweezers 125a-1 and 125a-2 will be simply described as the case 102, the process chamber 201 and the tweezers 125a.

As shown in FIG. 1, a wafer cooling mounting tool (cooling boat) 108 as a substrate cooling mounting tool for cooling a processed wafer 200 is provided on a wafer cooling table 109 in a space above the transfer chamber 203 and below a clean unit 166 to be described later. The wafer cooling mounting tool 108 has a structure similar to that of the boat 217 as the substrate holder to be described later, and is configured to horizontally hold a plurality of wafers 200 by a plurality of wafer holding grooves 107a to 107d in vertical multiple stages, as shown in FIG. 7 to be described later. As the wafer cooling mounting tool 108 and the wafer cooling table 109 are provided above the installation positions of the substrate loading and unloading port 134 and the gate valve 205 and below the clean unit 166, that is, installed between the gate valve 205 and the clean unit 166, so that they will deviate from the moving line of the wafer 200 when the wafer 200 is transferred by the transfer machine 125 from the pod 110 into the process chamber 201. This makes it possible to cool the processed wafer 200 without reducing the throughput of wafer processing (wafer transfer). Hereinafter, the wafer cooling mounting tool 108 and the wafer cooling table 109 may be collectively referred to as a cooling area. Further, each of the wafer holding grooves 107a to 107d is simply described as a wafer holding groove 107 unless it is necessary to distinguish between them.

(Process Furnace)

Figure 3:
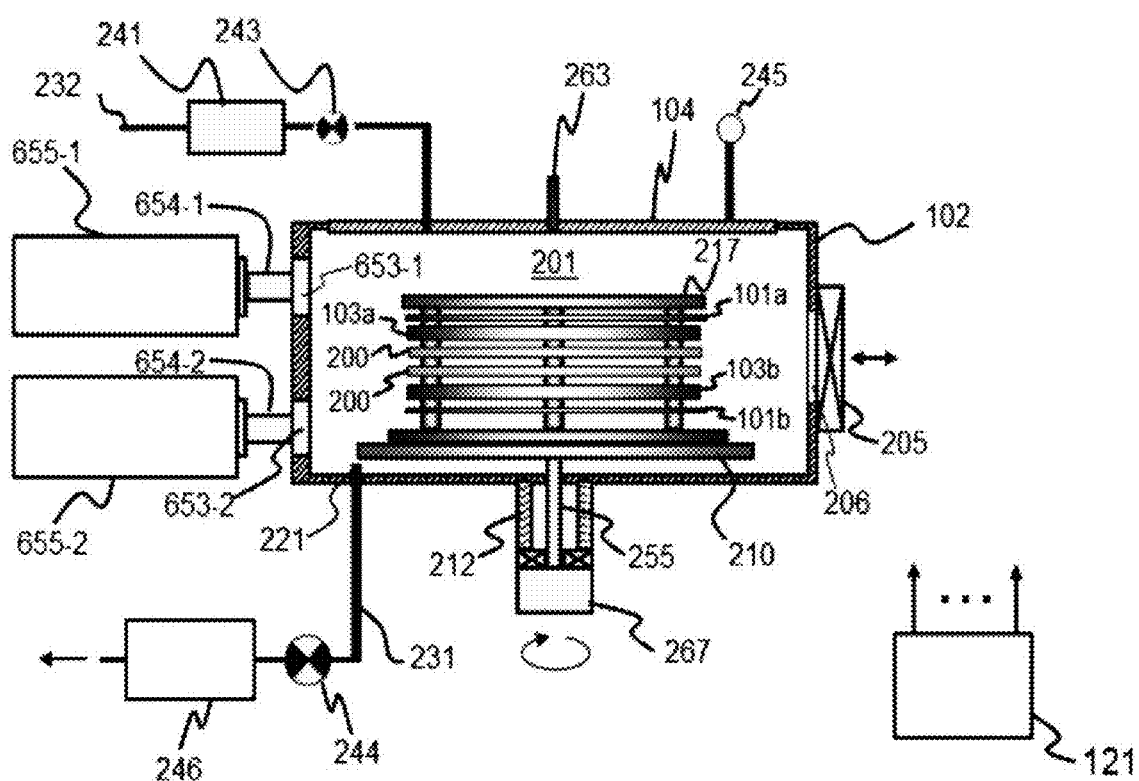
FIG. 3 is a schematic configuration view of a single-wafer type process furnace of the substrate processing apparatus suitably used in the embodiment of the present disclosure, in which the process furnace portion is shown in a longitudinal sectional view.

A process furnace having a substrate processing structure as shown in FIG. 3 is configured in an area A surrounded by a broken line in FIG. 1. Although a plurality of process furnaces are provided in the present embodiment as shown in FIG. 2, since the process furnaces have the same configuration, only one of them will be described and the description of the other is omitted.

As shown in FIG. 3, the process furnace has a case 102 as a cavity (process container) made of a material that reflects an electromagnetic wave, such as metal. Further, a cap flange (closing plate) 104 made of a metal material is configured to close the upper end of the case 102 via an O-ring (not shown) as a seal member. The inner space of the case 102 and the cap flange 104 is mainly configured as a process chamber 201 for processing a substrate such as a silicon wafer. A reaction tube (not shown) made of quartz through which an electromagnetic wave is transmitted may be installed within the case 102, or the process container may be configured such that the interior of the reaction tube becomes a process chamber. Further, without providing the cap flange 104, the process chamber 201 may be configured using the case 102 whose ceiling is closed.

A mounting table 210 is provided in the process chamber 201, and the boat 217 as the substrate holder for holding the wafer 200 as a substrate is mounted on the top surface of the mounting table 210. Wafers 200 to be processed and quartz plates 101a and 101b as heat insulating plates placed vertically above and below the wafers 200 so as to sandwich the wafers 200 are held in the boat 217 at predetermined intervals. In addition, susceptors (also referred to as energy conversion members, radiation plates or heat equalizing plates) 103a and 103b, such as silicon plates (Si plates) or silicon carbide plates (SiC plates), which indirectly heat the wafers 200 made of a dielectric substance such as a dielectric material which absorbs an electromagnetic wave to be heated itself, may be interposed between the quartz plates 101a and 101b and the wafers 200. This configuration makes it possible to heat the wafers 200 more efficiently and uniformly by radiant heat from the susceptors 103a and 103b. In the present embodiment, the quartz plates 101a and 101b and the susceptors 103a and 103b are the same components, and hereinafter, unless it is necessary to distinguish between them, they will be referred to as a quartz plate 101 or a susceptor 103.

The case 102 as a process container has, for example, a circular cross section and is configured as a flat sealed container. Further, the transfer container 202 as a lower container is made of, for example, a metal material such as aluminum (Al) or stainless steel (SUS), or quartz. A space surrounded by the case 102 may be referred to as a process chamber 201 or a reaction area 201 as a processing space, and a space surrounded by the transfer container 202 may be referred to as a transfer chamber 203 or a transfer area 203 as a transfer space. The process chamber 201 and the transfer chamber 203 are not limited to being horizontally adjacent to each other as in the present embodiment, but may be vertically adjacent to each other.

As shown in FIGS. 1 to 3, a substrate loading and unloading port 206 adjacent to the gate valve 205 is provided on the side surface of the transfer container 202, and the wafer 200 is moved between the process chamber 201 and the transfer chamber 203 via the substrate loading and unloading port 206. As a measure against electromagnetic wave leakage to be described later, a choke structure having a length of ¼ wavelength of the electromagnetic wave to be used is provided around the gate valve 205 or the substrate loading/unloading port 206.

An electromagnetic wave supply part as a heating device, which will be described in detail later, is installed on the side surface of the case 102. An electromagnetic wave such as a microwave supplied from the electromagnetic wave supply part is introduced into the process chamber 201 and heats the wafer 200 and the like to process the wafer 200.

The mounting table 210 is supported by a shaft 255 as a rotation axis. The shaft 255 penetrates the bottom of the transfer container 202 and is further connected to a drive mechanism 267 that performs a rotation operation outside the transfer container 202. By actuating the drive mechanism 267 to rotate the shaft 255 and the mounting table 210, it is possible to rotate the wafers 200 mounted on the boat 217. The periphery of the lower end portion of the shaft 255 is covered with a bellows 212, so that the interior of the process chamber 201 and the transfer area 203 is kept airtight.

Here, depending on the height of the substrate loading and unloading port 206, the mounting table 210 may be configured to be raised or lowered by the drive mechanism 267 so that the wafer 200 is placed at the wafer transfer position when the wafer 200 is transferred, and is placed at the processing position (wafer processing position) in the process chamber 201 when the wafer 200 is processed.

An exhaust part that exhausts the atmosphere of the process chamber 201 is provided below the process chamber 201 and on the outer peripheral side of the mounting table 210. As shown in FIG. 1, an exhaust port 221 is provided in the exhaust part. An exhaust pipe 231 is connected to the exhaust port 221, and a pressure regulator 244, such as an APC valve, which controls the valve opening degree according to the internal pressure of the process chamber 201, and a vacuum pump 246 are connected in series to the exhaust pipe 231.

Here, the pressure regulator 244 is not limited to the APC valve as long as it can receive the internal pressure information (a feedback signal from the pressure sensor 245 described later) of the process chamber 201 and adjust the exhaust amount based on the internal pressure information, but it may be configured to use an opening and closing valve and a pressure regulating valve together.

The exhaust part (also referred to as an exhaust system or an exhaust line) is mainly constituted by the exhaust port 221, the exhaust pipe 231 and the pressure regulator 244. The exhaust port may be provided to surround the mounting table 210 so that a gas can be exhausted from the entire periphery of the wafer 200. The vacuum pump 246 may be included in the exhaust part.

The cap flange 104 is provided with a gas supply pipe 232 for supplying processing gases for various types of substrates processing, such as an inert gas, a precursor gas, a reaction gas and the like into the process chamber 201.

A mass flow controller (MFC) 241, which is a flow rate controller (flow rate control part), and a valve 243, which is an opening/closing valve, are provided in the gas supply pipe 232 in this order y from the upstream side. For example, a nitrogen ($N_2$) gas source, which is an inert gas source, is connected to the upstream side of the gas supply pipe 232 and a $N_2$ gas is supplied from the $N_2$ gas source into the process chamber 201 via the MFC 241 and the valve 243. When plural types of gases are used for processing the substrate, the plural types of gases can be supplied by using a configuration in which a gas supply pipe provided with an MFC, which is a flow rate controller, and a valve, which is an opening and closing valve, in this order from the upstream side, is connected to the downstream side of the valve 243 of the gas supply pipe 232. A gas supply pipe provided with an MFC and a valve may be installed for each gas type.

A gas supply system (gas supply part) is mainly constituted by the gas supply pipe 232, the MFC 241 and the valve 243. When an inert gas is flown through the gas supply system, the gas supply system is also referred to as an inert gas supply system. As the inert gas, for example, a rare gas such as an Ar gas, a He gas, a Ne gas, a Xe gas or the like may be used in addition to the $N_2$ gas.

The cap flange 104 is provided with a temperature sensor 263 as a contactless temperature measuring device. By adjusting the output of a microwave oscillator 655 (which will be described later) based on the temperature information detected by the temperature sensor 263, the substrate is heated so that the substrate has a desired temperature distribution. The temperature sensor 263 is configured as a radiation thermometer such as an IR (Infrared Radiation) sensor. The temperature sensor 263 is installed to measure the surface temperature of the quartz plate 101a or the surface temperature of the wafer 200. When a susceptor as the above-mentioned heating member is provided, the temperature sensor 263 may be configured to measure the surface temperature of the susceptor. In the present disclosure, when the temperature (wafer temperature) of the wafer 200 is described, it means a wafer temperature converted by temperature conversion data to be described later, that is, an estimated wafer temperature, a temperature acquired by measuring the temperature of the wafer 200 by the temperature sensor 263, or both.

By acquiring in advance the transition of temperature change for each of the quartz plate 101 or the susceptor 103 and the wafer 200 by the temperature sensor 263, the temperature conversion data indicative of the temperature correlation between the quartz plate 101 or the susceptor 103 and the wafer 200 may be stored in a memory device 121c or an external memory device 123. By thus preparing the temperature conversion data in advance, the temperature of the wafer 200 can be estimated by measuring only the temperature of the quartz plate 101, and the output of the microwave oscillator 655, that is, the heating device, can be controlled based on the estimated temperature of the wafer 200.

As a means for measuring the substrate temperature, without being limited to the above-mentioned radiation thermometer, a thermocouple or both of a thermocouple and a contactless thermometer may be used to measure the temperature. However, when the temperature measurement is performed using the thermocouple, it is necessary to dispose the thermocouple in the vicinity of the wafer 200 to perform the temperature measurement. That is, since it is necessary to dispose the thermocouple within the process chamber 201, the thermocouple itself is heated by a microwave supplied from the microwave oscillator to be described later, so that the temperature cannot be measured accurately. Therefore, it is preferable to use a contactless thermometer as the temperature sensor 263.

In addition, the temperature sensor 263 may be provided on the mounting table 210 rather than on the cap flange 104. Further, the temperature sensor 263 may be not only installed directly on the cap flange 104 or the mounting table 210 but may be configured to indirectly measure the temperature by reflecting light emitted through a measurement window formed on the cap flange 104 or the mounting table 210 by a mirror or the like. Furthermore, the number of temperature sensors 263 is not limited to one but may be two or more.

Electromagnetic wave introduction ports 653-1 and 653-2 are formed on the side wall of the case 102. One ends of waveguides 654-1 and 654-2 for supplying an electromagnetic wave into the process chamber 201 are connected to the electromagnetic wave introduction ports 653-1 and 653-2, respectively. Microwave oscillators (electromagnetic wave sources) 655-1 and 655-2 as heating sources for supplying an electromagnetic wave into the process chamber 201 to heat the substrate are connected to the other ends of the waveguides 654-1 and 654-2, respectively. The microwave oscillators 655-1 and 655-2 supply electromagnetic waves such as microwaves to the waveguides 654-1 and 654-2, respectively. A magnetron, a klystron or the like is used as the microwave oscillators 655-1 and 655-2. Hereinafter, unless it is necessary to distinguish between them, the electromagnetic wave introduction ports 653-1 and 653-2, the waveguides 654-1 and 654-2 and the microwave oscillators 655-1 and 655-2 will be simply described as an electromagnetic wave introduction port 653, a waveguide 654 and a microwave oscillator 655, respectively.

The frequency of an electromagnetic wave generated by the microwave oscillator 655 is desirably controlled to fall within a frequency range of 13.56 MHz or more and 24.125 GHz or less. The frequency is more preferably controlled to be in a frequency range of 2.45 GHz or more and 5.8 GHz or less. Here, the respective frequencies of the microwave oscillators 655-1 and 655-2 may be equal to or different from each other.

Further, although two microwave oscillators 655 are described as being disposed on the side surface of the case 102 in the present embodiment, the present disclosure is not limited thereto, but one or more microwave oscillators 655 may be provided and they may be disposed at a different side surface such as the opposite side surface of the case 102. An electromagnetic wave supply part (also referred to as an electromagnetic wave supply device, a microwave supply part or a microwave supply device) as a heating device is mainly constituted by the microwave oscillators 655-1 and 655-2, the waveguides 654-1 and 654-2 and the electromagnetic wave introduction ports 653-1 and 653-2.

A controller 121 to be described later is connected to each of the microwave oscillators 655-1 and 655-2. The controller 121 is connected with the quartz plate 101a or 101b accommodated in the process chamber 201, or the temperature sensor 263 for measuring the temperature of the wafer 200. The temperature sensor 263 measures the temperature of the quartz plate 101 or the wafer 200 by the above-mentioned method and transmits it to the controller 121. The controller 121 controls the outputs of the microwave oscillators 655-1 and 655-2 to control the heating of the wafer 200. A method of controlling the heating by the heating device may include a method of controlling the heating of the wafer 200 by controlling a voltage input to the microwave oscillator 655, a method of controlling the heating of the wafer 200 by changing the ratio between a time for which the microwave oscillator 655 is powered on and a time for which the microwave oscillator 655 is powered off, etc.

Here, the microwave oscillators 655-1 and 655-2 are controlled by the same control signal transmitted from the controller 121. However, the present disclosure is not limited thereto, but the microwave oscillators 655-1 and 655-2 may be individually controlled by transmitting an individual control signal from the controller 121 to each of the microwave oscillators 655-1 and 655-2.

(Purge Gas Circulation Structure)

Figure 4:
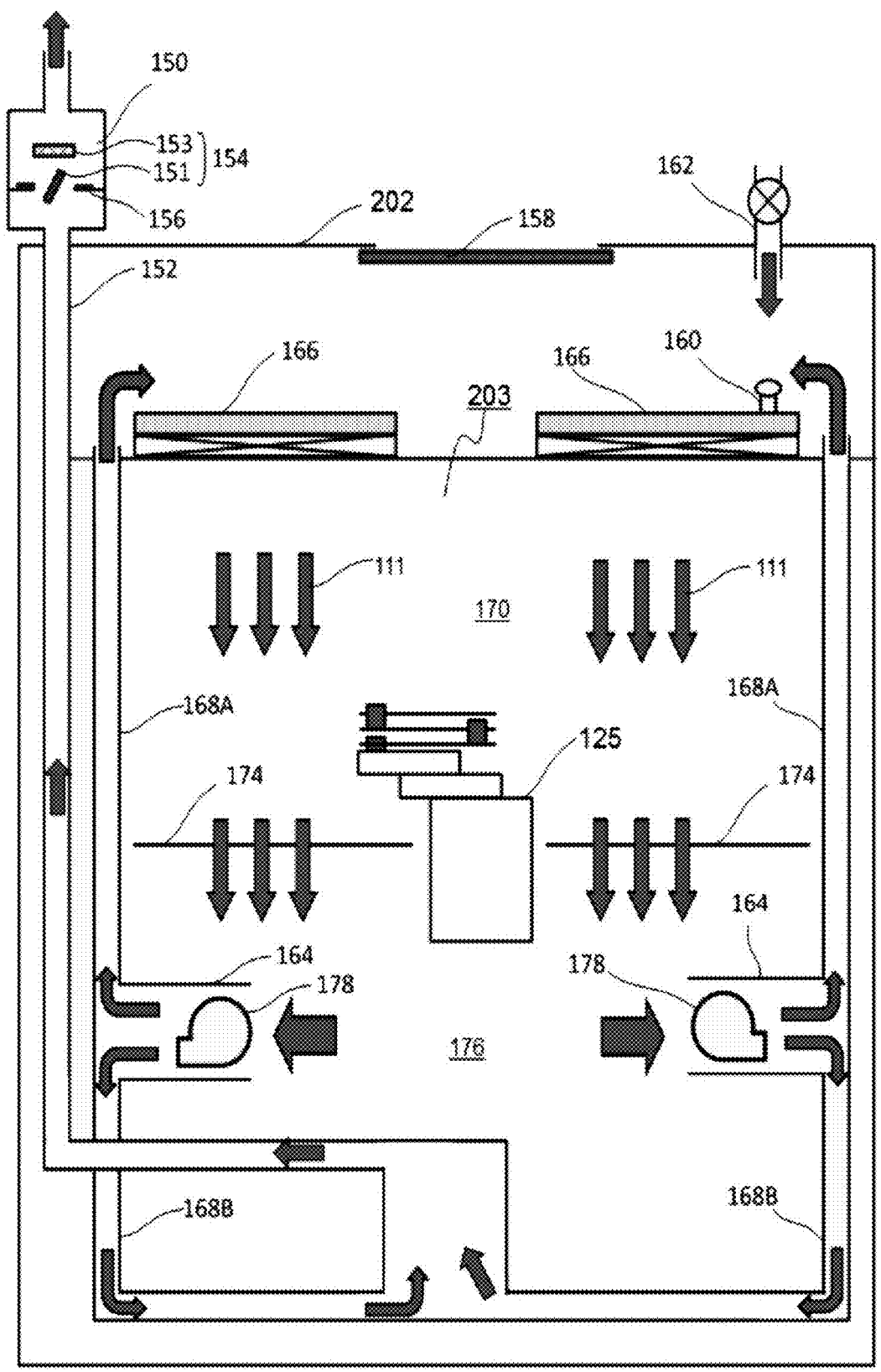
FIG. 4 is a view showing a purge gas circulation structure of a transfer chamber suitably used in the embodiment of the present disclosure.

Next, a purge gas circulation structure as a purge gas distribution mechanism provided in the transfer chamber 203 of the present embodiment will be described with reference to FIGS. 1 and 4. As shown in FIG. 4, the transfer chamber 203 includes a purge gas supply mechanism 162 for supplying an inert gas or air (fresh air) as a purge gas into a duct formed around the transfer chamber 203, and a pressure control mechanism 150 for controlling the internal pressure of the transfer chamber 203. The purge gas supply mechanism 162 is configured to supply the purge gas into the duct according to a value detected by a detector 160 that mainly detects the oxygen concentration in the transfer chamber 203. The detector 160 is installed above (in the upstream side) the clean unit 166, which is a gas supply mechanism that removes dusts and impurities and supplies a purge gas into the transfer chamber 203. The clean unit 166 is constituted by a filter for removing dusts and impurities and a blower (fan) for blowing the purge gas. The purge gas supply mechanism 162 and the pressure control mechanism 150 can control the oxygen concentration in the transfer chamber 203. Here, the detector 160 may be configured to be able to detect the water concentration in addition to the oxygen concentration. The inert gas as the purge gas may be the same gas species as the inert gas supplied into the process chamber 201 described above.

The pressure control mechanism 150 is constituted by an adjustment damper 154 formed to maintain the interior of the transfer chamber 203 at a predetermined pressure, and an exhaust damper 156 formed to fully open or fully close an exhaust path 152. The adjustment damper 154 is constituted by an auto damper (back pressure valve) 151 formed to be opened when the internal pressure of the transfer chamber 203 becomes higher than a predetermined pressure, and a press damper 153 formed to control opening/closing of the auto damper 151. By controlling the opening/closing of the adjustment damper 154 and the exhaust damper 156 in this manner, the interior of the transfer chamber 203 can be controlled to an arbitrary pressure.

As shown in FIG. 4, clean units 166 are disposed one by one on the left and right in the ceiling of the transfer chamber 203. A porous plate 174, which is a straightening plate for regulating the flow of the purge gas, is installed around the transfer machine 125. The porous plate 174 has a plurality of holes and is formed of, for example, a punching panel. The porous plate 174 partitions the inner space of the transfer chamber 203 into a first space 170, which is an upper space, and a second space 176, which is a lower space. That is, the first space 170, which is a wafer transfer area, is formed between the ceiling and the porous plate 174, and the second space 176, which is a gas exhaust area, is formed between the porous plate 174 and the floor of the transfer chamber 203.

At the lower portion of the second space 176 in the transfer chamber 203, suction parts 164 for circulating and exhausting the purge gas flowing in the transfer chamber 203 are disposed one by one on the left and right sides with the transfer machine 125 interposed therebetween. Further, a path 168 as a circulation path and an exhaust path connecting one pair of left and right suction parts 164 and one pair of left and right filter units 166, respectively, is formed in the wall surface of the housing 202, that is, between the outer wall surface and the inner wall surface of the housing 202. By providing a cooling mechanism (radiator) (not shown) for cooling a fluid in the path 168, it is possible to control the temperature of the circulating purge gas.

The path 168 is branched into two paths: a circulation path 168A and an exhaust path 168B. The circulation path 168A is a flow path connected to the upstream side of the clean unit 166 for supplying the purge gas into the transfer chamber 203 again. The exhaust path 168B is a flow path connected to the pressure control mechanism 150 for exhausts the purge gas. The exhaust paths 168B provided on the left and right of the housing 202 are merged into one external exhaust path 152 at the downstream side.

Next, the flow of a gas in the transfer chamber 203 will be described. Arrows shown in FIG. 4 schematically indicate the flow of the purge gas supplied from the purge gas supply mechanism 162. For example, when a $N_2$ gas (inert gas) as the purge gas is introduced into the transfer chamber 203, the $N_2$ gas is supplied from the ceiling of the transfer chamber 203 into the transfer chamber 203 via the clean unit 166 to form a down flow 111 in the transfer chamber 203. When the porous plate 174 provided in the transfer chamber 203 partitions the inner space of the transfer chamber 203 mainly into the first space 170, which is a region where the wafer 200 is transferred, and the second space 176 in which particles easily subside, a pressure difference is formed between the first space 170 and the second space 176. At this time, the pressure of the first space 170 is higher than the pressure of the second space 176. With such a configuration, it is possible to suppress scattering of particles generated from a driving part such as the transfer device elevator 125c below the tweezers 125a into the wafer transfer area. Further, it is possible to suppress the particles on the floor of the transfer chamber 203 from being rolled up to the first space 170.

The $N_2$ gas supplied into the second space 176 by the down flow 111 is sucked out of the transfer chamber 203 by the suction part 164. The $N_2$ gas sucked out of the transfer chamber 203 is divided into two flow paths of the circulation path 168A and the exhaust path 168B at the downstream of the suction part 164. The $N_2$ gas introduced into the circulation path 168A flows to the upper side of the housing 202 and is circulated in the transfer chamber 203 via the clean unit 166. Further, the $N_2$ gas introduced into the exhaust path 168B flows to the lower side of the housing 202 and is exhausted to the outside from the external exhaust path 152. Here, when the conductance of the path 168 is small, a fan 178 as a blower for promoting the circulation of the $N_2$ gas may be installed in the left and right suction parts 164. This fan 178 can improve the flow of the $N_2$ gas, which makes it easier to form a circulating gas flow. In this manner, by dividing the path 168 into two left and right lines for circulation and exhaustion, a uniform gas flow can be formed in the transfer chamber 203. The purge gas circulation structure is mainly constituted by the purge gas supply mechanism 162, the clean unit 166 and the path 168. The pressure control mechanism 150, the external exhaust path 152, the adjustment damper 154, the exhaust damper 156, the suction part 164, the first space 170, the second space 176 and the fan 178 may be included in the purge gas circulation structure.

Here, determination on whether to circulate the $N_2$ gas into the transfer chamber 203 may be made by controlling the opening/closing of the adjustment damper 154 and the exhaust damper 156. That is, when circulating the $N_2$ gas into the transfer chamber 203, it may be configured to make it easier to form a circulating gas flow into the transfer chamber 203 by opening the auto damper 151 and the press damper 153 and closing the exhaust damper 156. In this case, it may be configured to retain the $N_2$ gas introduced into the exhaust path 168B in the exhaust path 168B or flow the $N_2$ gas into the circulation path 168A. In addition, a cooling unit for cooling the gas circulating through the transfer chamber 203 may be provided.

Here, the internal pressure of the pod 110, the internal pressure of the transfer chamber 203 and the internal pressure of the process chamber 201 are all controlled to the atmospheric pressure or a pressure higher by about 10 to 200 Pa (gauge pressure) than the atmospheric pressure. It is desirable that the internal pressure of the transfer chamber 203 is higher than the internal pressure of the process chamber 201 and the internal pressure of the process chamber 201 is higher than the internal pressure of the pod 110.

(Controller)

Figure 5:
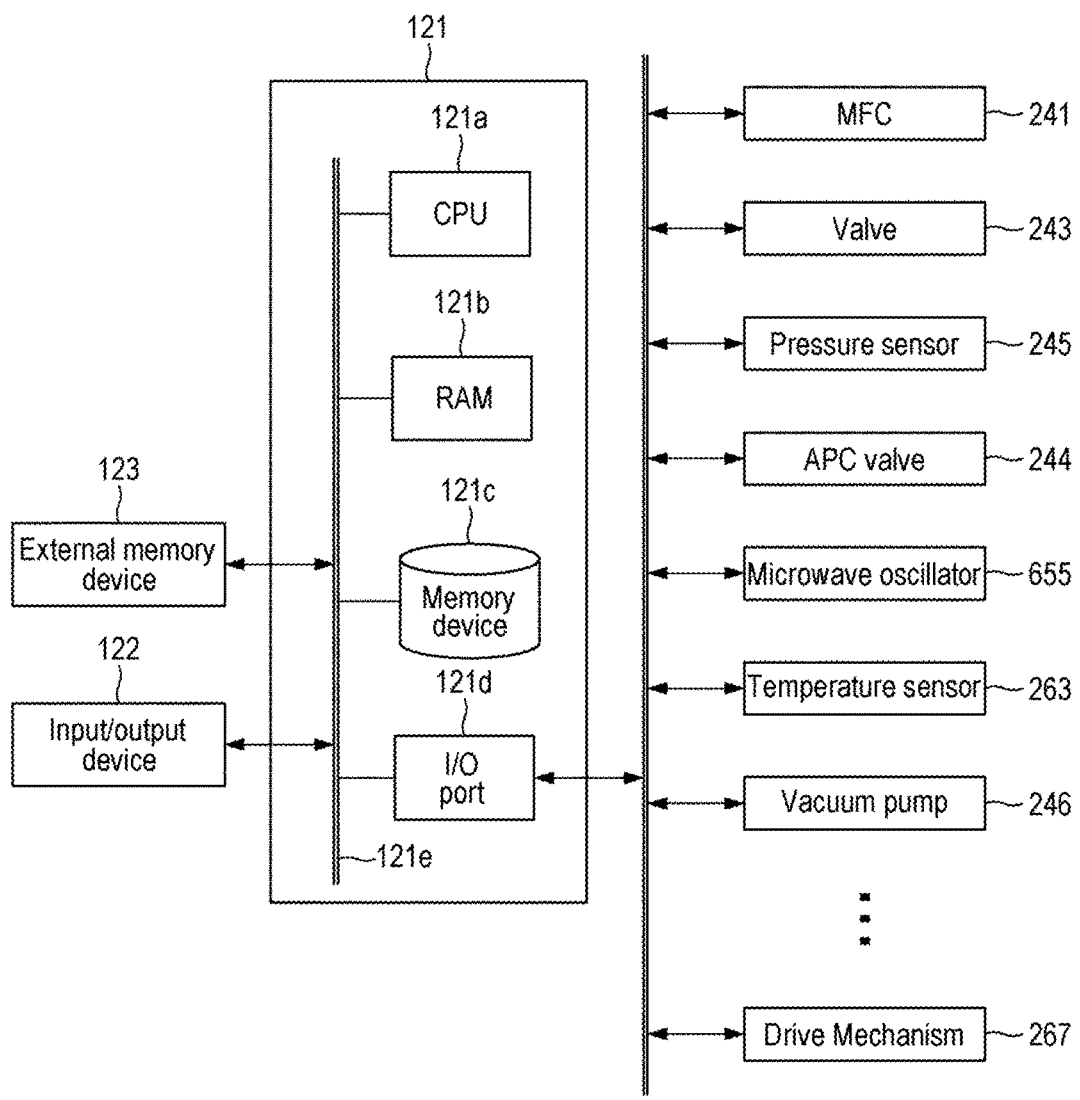
FIG. 5 is a schematic block diagram of a controller of the substrate processing apparatus suitably used in the present disclosure.

As shown in FIG. 5, the controller 121, which is a control part (control device or control means), is configured as a computer including a central processing unit (CPU) 121a, a random access memory (RAM) 121b, a memory device 121c and an I/O port 121d. The RAM 121b, the memory device 121c and the I/O port 121d are configured to be able to exchange data with the CPU 121a via an internal bus 121e. An input/output device 122 formed of, e.g., a touch panel or the like is connected to the controller 121.

The memory device 121c is configured with, for example, a flash memory, a hard disk drive (HDD) or the like. A control program for controlling operations of a substrate processing apparatus and a process recipe in which sequences and conditions of annealing (modifying) process are written, are readably stored in the memory device 121c. The process recipe function as a program for causing the controller 121 to execute each sequence in the substrate processing process, which will be described later, to obtain a predetermined result. Hereinafter, the process recipe and the control program will be generally and simply referred to as a "program". Furthermore, the process recipe will be simply referred to as a "recipe". When the term "program" is used herein, it may indicate a case of including only the recipe, a case of including only the control program, or a case of including both the recipe and the control program. The RAM 121b is configured as a memory area (work area) in which a program or data read by the CPU 121a is temporarily stored.

The I/O port 121d is connected to the MFC 241, the valve 243, the pressure sensor 245, the APC valve 244, the vacuum pump 246, the temperature sensor 263, the drive mechanism 267, the microwave oscillator 655 and the like described above.

The CPU 121a is configured to read and execute the control program from the memory device 121c. The CPU 121a also reads the recipe from the memory device 121c according to an input of an operation command from the input/output device 122. The CPU 121a is configured to control the flow rate adjusting operation of various kinds of gases by the MFC 241, the opening/closing operation of the valve 243, the pressure adjusting operation by the APC valve 244 based on the pressure sensor 245, the start and stop of the vacuum pump 246, the output adjusting operation of the microwave oscillator 655 based on the temperature sensor 263, the rotating operation and the rotation speed adjusting operation or the elevating operation of the mounting table 210 (or the boat 217) by the drive mechanism 267, and so on, so as to conform to contents of the read recipe.

The controller 121 may be configured by installing, on a computer, the aforementioned program stored in an external memory device 123 (for example, a magnetic disk such as a hard disk, an optical disk such as a CD, a magneto-optical disk such as an MO, a semiconductor memory such as a USB memory, or the like). The memory device 121c or the external memory device 123 is configured as a non-transitory computer-readable recording medium. Hereinafter, the memory device 121c and the external memory device 123 will be generally and simply referred to as a "recording medium". When the term "recording medium" is used herein, it may indicate a case of including only the memory device 121c, a case of including only the external memory device 123, or a case of including both the memory device 121c and the external memory device 123. Alternatively, the program may be supplied to the computer using communication means such as the Internet or a dedicated line, instead of using the external memory device 123.

(2) Substrate Processing Process

Next, as one of processes of manufacturing a semiconductor device using the process furnace of the above-described substrate processing apparatus 100, an example of a method of modifying (crystallizing) an amorphous silicon film as a silicon-containing film formed on a substrate will be described along the processing flow shown in FIG. 6. In the following description, the operations of various parts constituting the substrate processing apparatus 100 are controlled by the controller 121. Further, similarly to the above-described process furnace structure, even in the substrate processing process in the present embodiment, since the same processing contents, i.e., recipes, are used in a plurality of process furnaces, only the substrate processing process using one process furnace will be described, and explanation of the substrate processing process using the other process furnace is omitted.

When the term "wafer" is used in the present disclosure, it may refer to "a wafer itself" or "a wafer and a laminated body of predetermined layers or films formed on a surface of the wafer." When the phrase "a surface of a wafer" is used in the present disclosure, it may refer to "a surface of a wafer itself" or "a surface of a predetermined layer formed on a wafer." When the expression "a predetermined layer is formed on a wafer" is used in the present disclosure, it may mean that "a predetermined layer is directly formed on a surface of a wafer itself" or that "a predetermined layer is formed on a layer formed on a wafer." When the term "substrate" is used in the present disclosure, it may be synonymous with the term "wafer."

(Substrate Taking-Out Step (S401))

As shown in FIG. 1, the transfer machine 125 takes out a predetermined number of wafers 200 to be processed from the pod 110 opened by the load port unit 106, and places the wafers 200 on one or both of the tweezers 125a-1 and 125a-2.

(Substrate Loading Step (S402))

As shown in FIG. 3, the wafers 200 placed on one or both of the tweezers 125a-1 and 125a-2 are loaded into a predetermined process chamber 201 by the opening/closing operation of the gate valve 205 (boat loading) (S402).

(Furnace Internal Pressure/Temperature Adjusting Step (S403))

When the loading of the boat 217 into the process chamber 201 is completed, the internal atmosphere of the process chamber 201 is controlled so that the interior of the process chamber 201 has a predetermined pressure (for example, 10 to 102,000 Pa). Specifically, while exhausting the process chamber 201 by the vacuum pump 246, the valve opening degree of the pressure regulator 244 is feedback-controlled based on the pressure information detected by the pressure sensor 245 to set the interior of the process chamber 201 to a predetermined pressure. At the same time, as preheating, the electromagnetic wave supply part may be controlled to heat the interior of the process chamber 201 to a predetermined temperature (S403). When the interior of the process chamber 201 is raised to a predetermined substrate processing temperature by the electromagnetic wave supply part, it is preferable to raise the temperature of the interior of the process chamber 201 with an output smaller than the output of the modifying process to be described later so that the wafers 200 are not deformed or damaged. In addition, when performing the substrate processing under the atmospheric pressure, after performing only the furnace internal temperature adjustment without performing the furnace internal pressure adjustment, the process may be controlled to proceed to an inert gas supplying step S404 to be described below.

(Inert Gas Supplying Step (S404))

When the internal pressure and temperature of the process chamber 201 are controlled to the respective predetermined values by the furnace internal pressure/temperature adjusting step S403, the drive mechanism 267 rotates the shaft 255 to rotate the wafers 200 via the boat 217 on the mounting table 210. At this time, an inert gas such as a nitrogen gas is supplied via the gas supply pipe 232 (S404). Further, at this time, the internal pressure of the process chamber 201 is a predetermined value in the range of 10 Pa to 102,000 Pa, and is adjusted to, for example, 101,300 Pa to 101,650 Pa. The shaft may be rotated at the time of the substrate loading step S402, that is, after the loading of the wafers 200 into the process chamber 201 is completed.

(Modifying Step (S405))

When the interior of the process chamber 201 is maintained at a predetermined pressure, the microwave oscillator 655 supplies a microwave into the process chamber 201 through the above-described parts. The microwave supplied into the process chamber 201 heats the wafers 200 to a temperature of 100 degrees C. to 1,000 degrees C., suitably a temperature of 400 degrees C. to 900 degrees C., more suitably a temperature of 500 degrees C. to 700 degrees C. By performing the substrate processing at such a temperature, the wafers 200 can be processed at a temperature at which the wafers 200 efficiently absorbs the microwave, thereby increasing the speed of the modifying process. In other words, if the wafers 200 are processed at a temperature lower than 100 degrees C. or higher than 1,000 degrees C., the surfaces of the wafers 200 are degenerated, which makes it difficult for the wafers 200 to absorb the microwave. This makes it difficult to heat the wafers 200. Therefore, it is desirable to perform the substrate processing at the above-described temperature range.

In the present embodiment in which the heating is performed by the microwave heating method, in order to prevent the wafers 200 (and the susceptor 103 as well) from being deformed due to heating concentration areas (hot spots) locally heated and other areas not heated (non-heated areas) on the wafers 200 (and the susceptor 103 as well), which are formed due to standing waves generated in the process chamber 201, the generation of the hot spots on the wafers 200 is suppressed by controlling the power ON/OFF of the electromagnetic wave supply part. At this time, it is also possible to suppress the deformation of the wafers 200 by controlling the power supplied from the electromagnetic wave supply part to a low output so as to reduce the influence of the hot spots. However, in this case, since the energy applied to the wafers 200 and the susceptor 103 is reduced, the amount of rise of the temperature is small. Accordingly, there is a need to extend the heating time.

Here, as described above, when the temperature sensor 263 is a contactless temperature sensor and the wafers 200 (and the susceptor 103 as well) to be measured are deformed or damaged, since the position of the wafers 200 to be monitored by the temperature sensor and the measurement angle with respect to the wafers 200 are changed, the measured value (monitored value) becomes inaccurate and the measured temperature changes rapidly. In the present embodiment, the rapid change of the measured temperature of the radiation thermometer due to such deformation or damage of the measurement target is used as a trigger for turning on/off the electromagnetic wave supply part.

As described above, the microwave oscillator 655 is controlled to heat the wafers 200 so that an amorphous silicon film formed on the surfaces of the wafers 200 is modified (crystallized) into a polysilicon film (S405). That is, the wafers 200 can be modified uniformly. When the measured temperature of the wafers 200 is higher or lower than the above-mentioned threshold, rather than turning off the microwave oscillator 655, the output of the microwave oscillator 655 may be lowered so that the temperature of the wafers 200 falls within a predetermined temperature range. In this case, when the temperature of the wafers 200 returns to the predetermined temperature range, the output of the microwave oscillator 655 is raised.

When the preset processing time elapses, the rotation of the boat 217, the supply of gas, the supply of microwave and the exhaust of the exhaust pipe are stopped.

(Substrate Unloading Step (S406))

After the internal pressure of the process chamber 201 is returned to the atmospheric pressure, the gate valve 205 is opened to spatially connect the process chamber 201 and the transfer chamber 203. Thereafter, the wafers 200 placed on the boat are unloaded to the transfer chamber 203 by the tweezers 125a of the transfer machine 125 (S406).

(Substrate Cooling Step (S407))

Figure 7A:
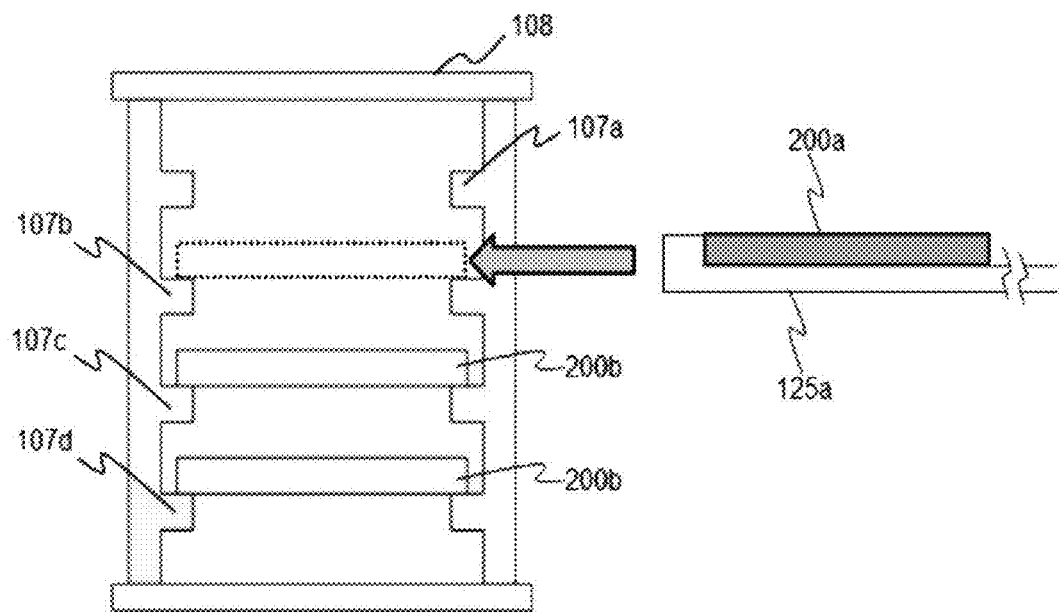
FIG. 7A is a view schematically showing a method of loading a wafer into a cooling area.
Figure 7B:
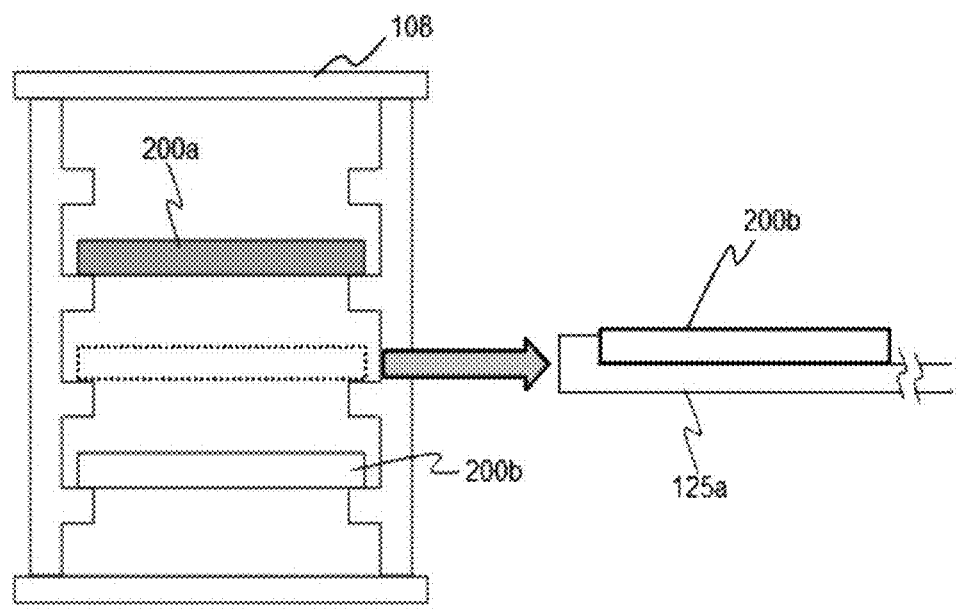
FIG. 7B is a view schematically showing a method of unloading a cooled wafer from the cooling area.

The wafers 200 unloaded by the tweezers 125a are moved to the cooling area by the continuous operation of the transfer device 125b and the transfer device elevator 125c, and is mounted on the wafer cooling mounting tool 108 by the tweezers 125a. Specifically, as shown in FIG. 7A, a wafer 200a subjected to the modifying step S405 and held by the tweezers 125a-1 is transferred to the wafer holding groove 107b formed in the wafer cooling mounting tool 108, and is cooled by being placed for a predetermined time (S407). At this time, as shown in FIG. 7B, in a case where a cooled wafer 200b that has already been cooled is already mounted on the wafer cooling mounting tool 108, the tweezers 125a-1 that placed the wafer 200a subjected to the modifying step S405 on the wafer holding groove 107b or another free tweezers (e.g., the tweezers 125a-2) transfers the cooled wafer 200b to a load port, i.e., the pod 110.

Here, as shown in FIG. 1, since the cooling area is disposed in the vicinity of the clean unit 166, that is, at a position facing at least a portion of a purge gas outlet (gas outlet of the fan) of the clean unit, it becomes possible to cool the wafer 200a which has been highly heated by the modifying step S405. Further, it becomes possible to use a gas with few impurities and particles, and it becomes also possible to suppress the film quality deterioration of a thin film formed on the wafer 200a. Further, the wafer cooling mounting tool 108 may be provided with a disk-shaped ceiling plate having a diameter equal to or larger than the diameter of the wafers 200 above the wafer holding grooves 107 on which the wafers 200 are mounted. This makes it possible to suppress deformation of the wafers 200 due to uniform cooling of the wafers 200 by rapid cooling caused by direct spraying of the down flow 111 from the clean unit 166 onto the wafers 200.

By repeating the above-described operation, the wafers 200 are modified, and the process proceeds to the next substrate processing step. Further, although it has been illustrated in FIG. 3 that the substrate processing is performed on two wafers 200 placed on the boat 217, the present disclosure is not limited thereto. For example, as shown in FIG. 8A, the same processing may be performed on one wafer 200 placed on the boat 217 installed in each of the process chambers 201-1 and 201-2, or as shown in FIG. 8 (B), the wafers 200 may be processed two by two (#1, #2) in the process chambers 201-1 and 201-2 by performing swap processing. At this time, the transfer destination of the wafers 200 may be controlled so that the number of times of substrate processing performed in the process chamber 201-1 is equal to the number of times of substrate processing performed in the process chamber 201-2. By performing the control in this manner, the number of times of performance of the substrate processing in each of the process chambers 201-1 and 201-2 becomes constant, which facilitates efficient performance of preservation work such as maintenance. For example, when a process chamber into which a previous wafer 200 is transferred is the process chamber 201-1, the transfer destination of the next wafer 200 is controlled to be the process chamber 201-2, thereby controlling the number of times of performance of the substrate processing in each of the process chambers 201-1 and 201-2.

Further, the tweezers 125a-1 and 125a-2 may be respectively provided as a high temperature tweezers for transferring a wafer 200 which has been highly heated by the substrate processing and a low temperature tweezers for transferring a wafer 200 which has been not highly heated by the substrate processing. For example, by using the tweezers 125a-1 as the high temperature tweezers and the tweezers 125a-2 as the low temperature tweezers, the wafer 200 which has been highly heated by the modifying step S405 may be transferred into the cooling area by only the tweezers 125a-1, and may be transferred by the tweezers 125a-2 at a transfer timing other than the timing of unloading the wafer 200 from the process chamber 201.

(3) Effects of the Present Embodiment

According to the present embodiment, one or more of the following effects can be obtained.

(a) By providing the cooling area of a wafer above the transfer space, i.e., above the installation position of the substrate loading/unloading port and the gate valve, the wafer can deviate from the moving line when transferring the wafer from the pod to the process chamber, which makes it possible to cool a processed wafer without reducing the throughput of wafer processing. That is, it is possible to improve wafer productivity.

(b) By providing the cooling area above the transfer space, i.e., in the vicinity of the clean unit, it is possible to use an inert gas or air supplied from the clean unit as a cooling gas, which facilitates efficient wafer cooling.

(c) By providing a ceiling plate equal to or larger than the wafer diameter in the wafer cooling mounting tool, it is possible to suppress direct spraying of an inert gas or air supplied from the clean unit onto the wafer surface, thereby suppressing deformation of the wafer.

Modification of the Embodiment

The substrate processing apparatus according to the present embodiment is not limited to the above-described aspect, but may be changed as in the following modification.

Figure 9:
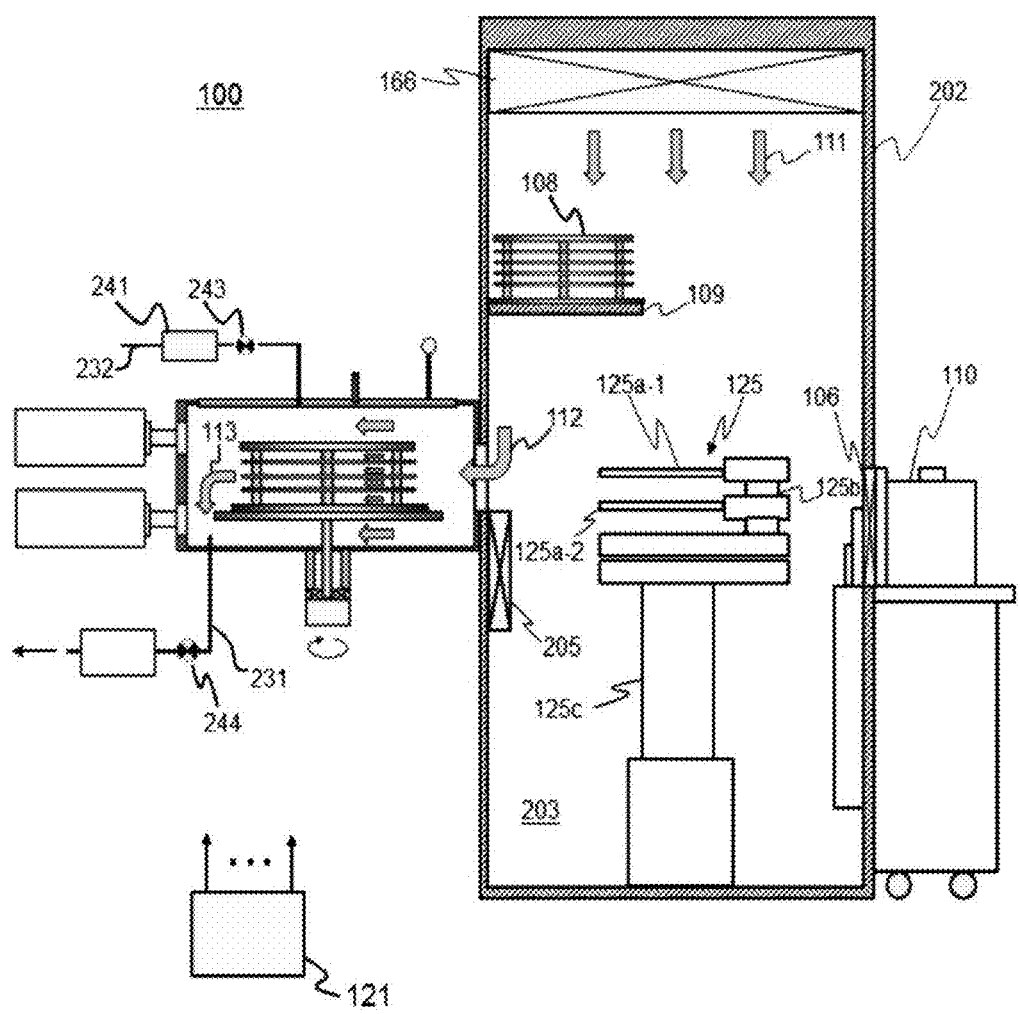
FIG. 9 is a view showing a modification suitably used in the embodiment of the present disclosure.

After the modifying step S405 on the wafer 200 is completed, before performing the substrate unloading step S406, by operating the exhaust part installed in the process chamber 201 while keeping the gate valve 205 opened as shown in FIG. 9, that is, in a state where the process chamber 201 and the transfer chamber 203 are spatially connected, a portion of the down flow 111 formed by the inert gas or air supplied from the clean unit 166 may be introduced into the process chamber 201.

For example, specifically, when the modifying step S405 is completed, the controller 121 opens the gate valve 205. When the gate valve 205 is opened, a portion of the down flow 111 formed in the process chamber 201 forms a gas flow 112 to be introduced into the process chamber 201, thereby forming a cooling gas flow which is horizontal to the surface of the wafer 200 in the process chamber 201. A gas flow passed through a region where the wafer 200 is held becomes a flow (gas flow 113) directed to the exhaust port 221 by the pressure regulator 244, which is controlled by the controller 121 so as to be fully opened, and the vacuum pump 246, and is exhausted from the interior of the process chamber 201. The down flow 111 not introduced into the process chamber 201 is circulated or exhausted by the above-described purge gas circulation structure.

At this time, the gas flow 112 introduced into the process chamber 201 from the down flow 111 is preferably controlled to have a flow rate (exhaust flow rate) equal to or less than the exhaust capacity of the vacuum pump 246. If the gas flow 112 having a flow rate larger than the exhaust flow rate of the vacuum pump 246 is supplied into the process chamber 201, the exhaust of the interior of the process chamber 201 by the vacuum pump 246 does not catch up, and a gas stagnates in the process chamber 201. As a result, an unnecessary gas whirlpool may be generated to cause particles to be wound up, which may cause the particles to adhere to the wafer surface. Therefore, a gas flow meter, which is a gas flow measuring device for controlling the flow rate of the gas flow 112, may be provided near the substrate loading/unloading port 206. Further, in order to control the flow rate of the gas flow 112, the opening degree of the gate valve 205 may be controlled to control the opening degree of the substrate loading/unloading port 206 which is an inlet of the gas flow 112.

Further, at this time, the valve 243 may be opened to supply an inert gas as a cooling gas from the gas supply pipe 232 so as to cool the wafer 200 more efficiently. Further, preferably, the ratio between the flow rate of the purge gas supplied into the transfer chamber 203 (or the flow rate of the purge gas flowing in the transfer chamber 203 after a portion of the purge gas is introduced into the process chamber 201) and the flow rate of the purge gas introduced into the process chamber 201 is controlled to be equal to one of more of the ratio between the exhaust amount of the fan 178 and the exhaust amount of the vacuum pump 246, the ratio between the conductance of the path 168 and the conductance of the exhaust path 231, and the ratio between the conductance of the external exhaust path 152 and the conductance of the exhaust path 231.

Further, in the present modification, the internal pressure of the process chamber 201 may be under a reduced pressure or under the atmospheric pressure. However, since it is necessary to introduce a portion of the down flow 111 into the process chamber 201, the internal pressure of the process chamber 201 is preferably controlled by the controller 121 so as to be equal to or lower than the internal pressure of the transfer chamber 203. In the present embodiment, if the substrate processing is performed at the same pressure as the internal pressure of the transfer chamber 203, after the modifying step S405 is completed and the gate valve 205 is opened, the vacuum pump 246 may be operated to make the internal pressure of the process chamber 201 equal to or lower than the internal pressure of the chamber 203. Further, if the internal pressure of the process chamber 201 is higher than the internal pressure of the transfer chamber 203, in order to prevent heat in the process chamber 201 from introducing into the transfer chamber 203 when the gate valve 205 is opened, an inert gas as a cooling gas may be supplied from near the substrate loading/unloading port 206.

Another Embodiment of the Present Disclosure

As shown in FIG. 3, in the embodiment of the present disclosure described above, the configuration has been described in which a plurality of wafers 200 are simultaneously processed collectively by placing two wafers 200 on the boat 217. However, depending on the number of wafers 200 that are stored or storable in the pod, it may be necessary to process only one wafer 200. In such a case, if the same control as the condition for collectively processing a plurality of wafers is performed, it is difficult to obtain the same results because the heat insulation rate around the wafer 200 placed on the boat 217 differs. If processing is to be performed using a substitute for the wafer 200, such as a dummy wafer, in order to bring the heat insulation rate around the wafer closer to that in the case of batch processing of multiple wafers, it becomes necessary to add a process for transferring the dummy wafer or the like, which may result in decrease in productivity of substrate processing.

Another embodiment of the present disclosure is different from the above-described embodiment of the present disclosure in that the microwave oscillator 655 is controlled by the controller 121 by providing a predetermined control table so as to obtain the same film quality as in the two-wafer processing without using a substitute for the wafer 200, such as a dummy wafer, while using the substrate flow used in the above-described embodiment of the present disclosure. The other points are the same as those of the above-described embodiment of the present disclosure, and therefore, explanation thereof will not be repeated.

Figure 10A:
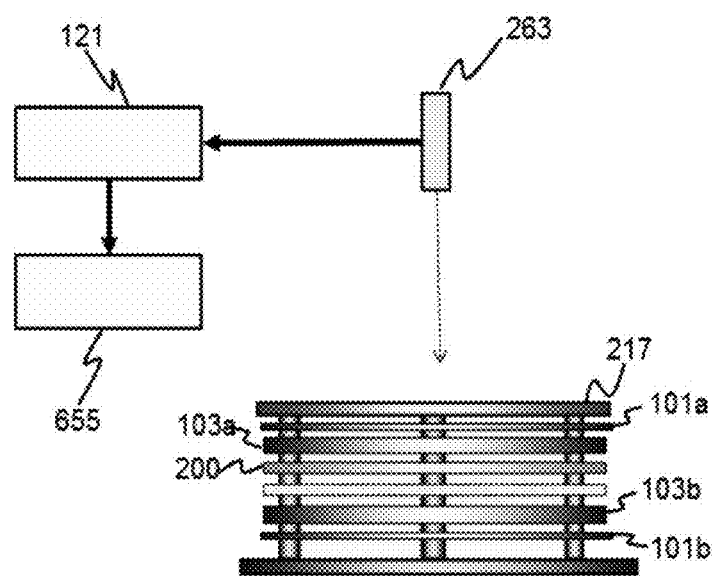
FIG. 10A is a view showing an example in a case of creating a temperature table by measuring a temperature change when one wafer is held on the upper stage portion of a substrate holding tool.
Figure 10B:
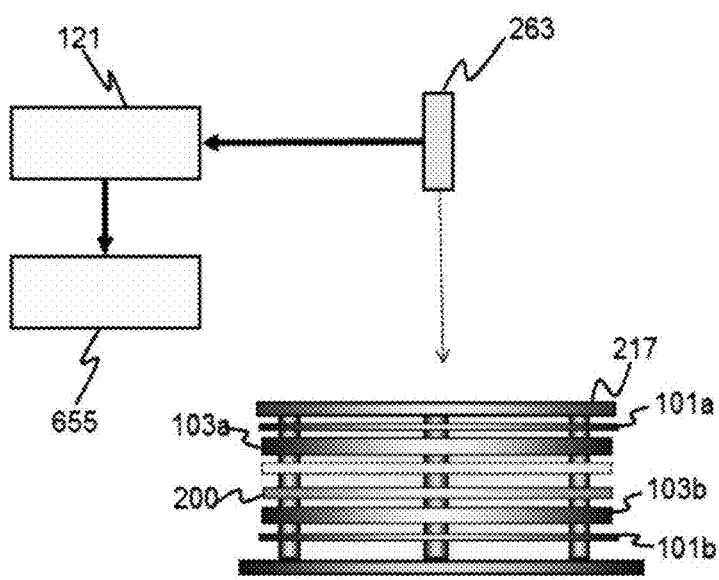
FIG. 10B is a view showing an example in a case of creating a temperature table by measuring a temperature change when one wafer is held on the lower stage portion of the substrate holding tool.

In the present embodiment, as shown in FIG. 10A, for example, in a state where one wafer 200 is held in advance in the upper stage portion of the boat 217 where the wafer can be held, the processing flow shown in FIG. 6 is used to perform the substrate processing, and a change in temperature is measured by the temperature sensor 263. The measured temperature is transmitted to the controller 121 and is stored in the memory device 121c or the external memory device 123 as a temperature table recording the temperature change. Similarly, as shown in FIG. 10B, in a state where one wafer 200 is held in advance in the lower stage portion of the boat 217 where the wafer can be held, the processing flow shown in FIG. 6 is used to perform the substrate processing, and a change in temperature is measured by the temperature sensor 263. The measured temperature is transmitted to the controller 121 and is stored in the memory device 121c or the external memory device 123 as a temperature table recording the temperature change. Thereafter, when performing the substrate processing (when performing the main processing), the controller 121 reads the temperature table stored by the temperature measurement shown in FIGS. 10A and 10B, adjusts the output of the microwave oscillator 655, and performs the substrate processing according to the processing flow shown in FIG. 6.

By this control, even when the number of wafers 200 to be processed is one, it is possible to obtain the same film quality as in the case of processing a plurality of wafers. Further, since it is not necessary to use a substitute for the wafer 200, such as a dummy wafer, it is possible to suppress the decrease in throughput.

Modification of the Another Embodiment

The substrate processing apparatus according to the present embodiment is not limited to the above-described aspect, but may be changed as in the following modification.

Figure 11A:
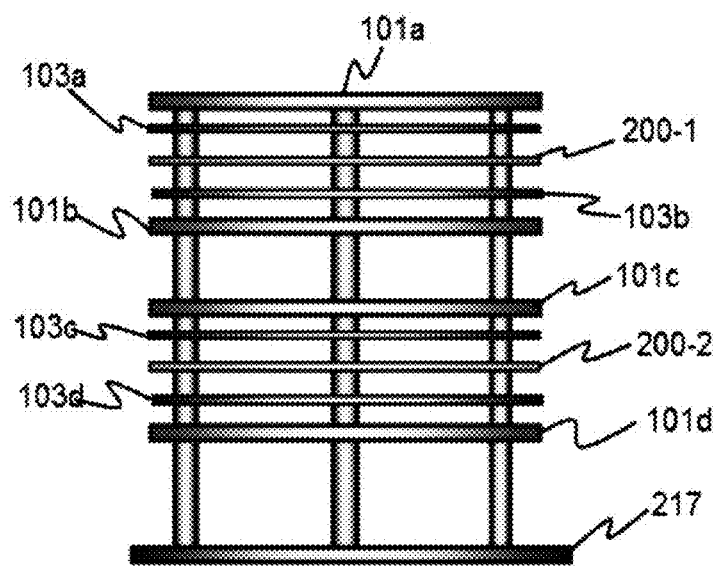
FIG. 11A is a view showing a substrate holding tool for holding a wafer according to a modification which is suitably used in another embodiment.

As shown in FIG. 11A, a modification of the another embodiment is different from the above-described another embodiment in that the boat 217 on which the quartz plate 101 as a heat insulator, the susceptor 103 as a dielectric, and the wafer 200 as a workpiece are placed is replaced with a boat 217 on which a quartz plate 101a, a susceptor 103a, a wafer 200-1, a susceptor 103b, a quartz plate 101b, a quartz plate 101c, a susceptor 103c, a wafer 200-2, a susceptor 103d and a quartz plate 101d are placed in this order from above.

Figure 11B:
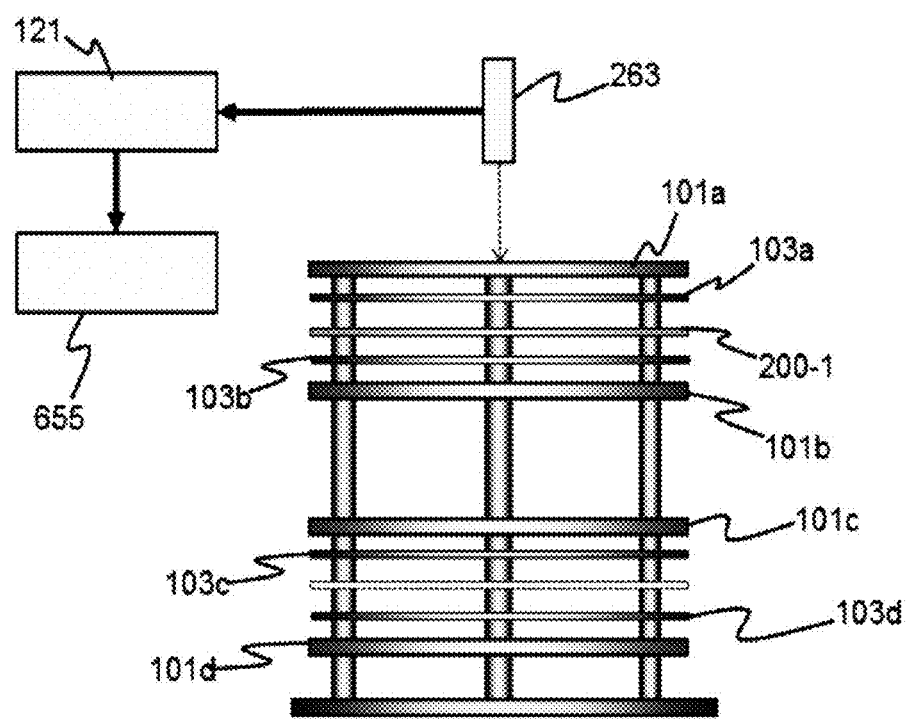
FIG. 11B is a view showing an example in a case of creating a temperature table by measuring a temperature change when one wafer is held on the upper stage portion of the substrate holding tool using FIG. 11A.

Even in the present modification, as shown in FIG. 11B, in a state where one wafer 200 is held in advance in the upper stage portion of the boat 217 where the wafer can be held, the processing flow shown in FIG. 6 is used to perform the substrate processing, and a change in temperature is measured by the temperature sensor 263. The measured temperature is transmitted to the controller 121 and is stored in the memory device 121c or the external memory device 123 as a temperature table recording the temperature change. Thereafter, when performing the substrate processing (when performing the main processing), the controller 121 reads the temperature table stored by the temperature measurement shown in FIG. 11B, adjusts the output of the microwave oscillator 655, and performs the substrate processing according to the processing flow shown in FIG. 6.

Since the wafer holding position shown in FIG. 11A is different from the wafer holding position shown in FIG. 10 (i.e., the wafers 200 are not held continuously and vertically), without performing the temperature measurement in a case where no wafer is held at the position of the wafer 200-1 in FIG. 11A, there is no problem if the substrate processing is performed only with the temperature table acquired by the temperature measurement method shown in FIG. 11B. However, in a state where the wafer 200 is not held at the position of the wafer 200-1 and the wafer 200 is held at the position of the wafer 200-2, it is more preferable to measure the temperature, create a temperature table, and perform the substrate processing (main processing).

Although the present disclosure has been described above by way of embodiments, the above-described embodiments and modifications can be used in proper combination to obtain the same effects.

For example, a process of modifying an amorphous silicon film consisting mainly of silicon into a polysilicon film has been described in each of the above-described embodiments, but the present disclosure is not limited thereto. For example, a gas containing at least one of oxygen (O), nitrogen (N), carbon (C) and hydrogen (H) may be supplied to modify a film formed on the surface of the wafer 200. For example, when a hafnium oxide film (HfxOy film) as a high dielectric film is formed on the wafer 200, by supplying a microwave to heat the wafer 200 while supplying a gas containing oxygen, the defective oxygen in the hafnium oxide film can be supplemented to improve the characteristics of the high dielectric film.

Although the hafnium oxide film is described here, the present disclosure is not limited thereto. The present disclosure can be suitably applied to a case of modifying a metal-based oxide film which is an oxide film containing a metal element including at least one selected from the group of aluminum (Al), titanium (Ti), zirconium (Zr), tantalum (Ta), niobium (Nb), lanthanum (La), cerium (Ce), yttrium (Y), barium (Ba), strontium (Sr), calcium (Ca), lead (Pb), molybdenum (Mo) and tungsten (W). That is, the above-described film-forming sequence can be suitably applied to a case of modifying a TiOCN film, a TiOC film, a TiON film, a TiO film, a ZrOCN film, a ZrOC film, a ZrON film, a ZrO film, a HfOCN film, a HfOC film, a HfON film, a HfO film, a TaOCN film, a TaOC film, a TaON film, a TaO film, a NbOCN film, a NbOC film, a NbON film, a NbO film, an AlOCN film, an AlOC film, an AlON film, an AlO film, a MoOCN film, a MoOC film, a MoON film, a MoO film, a WOCN film, a WOC film, a WON film and a WO film on the wafer 200.

Further, without being limited to the high dielectric film, a film consisting mainly of silicon doped with an impurity may be heated. An example of the film consisting mainly of silicon may include a Si-based oxide film such as a silicon nitride film (SiN film), a silicon oxide film (SiO film), a silicon oxycarbide film (SiOC film), a silicon oxycarbonitride film (SiOCN film), a silicon oxynitride film (SiON) or the like. The impurity includes at least one of, for example, bromine (B), carbon (C), nitrogen (N), aluminum (Al), phosphorus (P), gallium (Ga), arsenic (As) and the like.

In addition, the film formed on the wafer may be a resist film based on at least one of a methyl methacrylate resin (polymethyl methacrylate: PMMA), an epoxy resin, a novolac resin, a polyvinylphenyl resin and the like.

Although one of the manufacturing processes of the semiconductor device has been described above, the present disclosure is not limited thereto. For example, the present disclosure can be also applied to any techniques for processing a substrate, such as patterning in a process of manufacturing a liquid crystal panel, patterning in a process of manufacturing a solar cell, patterning in a process of manufacturing a power device, and the like.

INDUSTRIAL APPLICABILITY

As described above, according to the present disclosure, it is possible to provide an electromagnetic wave processing technique capable of suppressing a decrease in productivity even when a substrate cooling process is provided.

According to the present disclosure in some embodiments, it is possible to provide an electromagnetic wave processing technique capable of suppressing a decrease in productivity even when a substrate cooling process is provided.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
a process chamber including a gate valve that opens and closes a loading and unloading port configured to load and unload a substrate, and configured to heat and process the substrate by a heater using a microwave;
a substrate transfer chamber including a purge gas distribution mechanism configured to distribute a purge gas supplied from a clean unit capable of introducing the purge gas;
a transfer machine installed inside the substrate transfer chamber and configured to transfer the substrate into the process chamber; and a substrate cooling mounting tool configured to cool the substrate transferred from the process chamber by the transfer machine, wherein the process chamber includes an exhaust part configured to exhaust an internal atmosphere of the process chamber, and wherein the substrate processing apparatus further comprises a controller configured to control an exhaust amount of the exhaust part, while opening the gate valve after processing the substrate, such that a portion of the purge gas supplied from the clean unit into the substrate transfer chamber flows into the process chamber.

2. The substrate processing apparatus of claim 1, wherein the purge gas distribution mechanism includes a circulation path configured to circulate the purge gas and an exhaust path configured to exhaust the purge gas in a housing forming the substrate transfer chamber.

3. The substrate processing apparatus of claim 2, wherein the purge gas distribution mechanism includes a pressure control mechanism configured to control an internal pressure of the substrate transfer chamber.

4. The substrate processing apparatus of claim 1, wherein the process chamber further includes a gas supply part configured to supply a predetermined gas, and wherein the controller is further configured to control the gas supply part such that a purge gas is supplied from the gas supply part while opening the gate valve.

5. The substrate processing apparatus of claim 1, wherein the controller is further configured to control the exhaust part such that a flow rate of the purge gas flowing into the process chamber becomes smaller than an exhaust flow rate of the exhaust part.

6. The substrate processing apparatus of claim 1, wherein the controller is further configured to control a flow rate of the purge gas flowing into the process chamber according to an opening degree of the gate valve.

7. The substrate processing apparatus of claim 1, wherein the process chamber includes a gas flow rate measuring device configured to measure a flow rate of the purge gas flowing into the process chamber.

8. The substrate processing apparatus of claim 1, wherein the purge gas from the clean unit is supplied into the substrate transfer chamber along a predetermined path, and wherein the controller is configured to control the exhaust part such that a ratio between a flow rate of the purge gas flowing into the process chamber and a flow rate of the purge gas flowing into the substrate transfer chamber is equal to a ratio between a conductance of the exhaust part and a conductance of the predetermined path.

9. The substrate processing apparatus of claim 1, wherein the substrate cooling mounting tool is provided with a ceiling plate having a diameter equal to or larger than a diameter of the substrate.

10. The substrate processing apparatus of claim 1, wherein the substrate transfer chamber further includes a detector for detecting oxygen concentration in the substrate transfer chamber, and wherein the controller is configured to control the purge gas distribution mechanism based on a detection value of the detector.

11. A method of manufacturing a semiconductor device in a substrate processing apparatus which includes:

a process chamber including an exhaust part configured to exhaust an internal atmosphere of the process chamber and a gate valve that opens and closes a loading/unloading port configured to load and unload a substrate, and configured to heat and process the substrate by a heater using a microwave;

a substrate transfer chamber including a purge gas distribution mechanism configured to distribute a purge gas supplied from a clean unit capable of introducing the purge gas, a transfer machine installed inside the substrate transfer chamber and configured to transfer the substrate into the process chamber;

a substrate cooling mounting tool configured to cool the substrate transferred from the process chamber by the transfer machine; and a controller configured to control an exhaust amount of the exhaust part, the method comprising:

transferring the substrate into the process chamber;

performing a predetermined modifying process by heating the substrate;

controlling, by the controller, the exhaust amount of the exhaust part, while opening the gate valve after performing the predetermined modifying process, such that a portion of the purge gas supplied from the clean unit into the substrate transfer chamber flows into the process chamber; and cooling the substrate after the modifying process by mounting the substrate on the substrate cooling mounting tool by the transfer machine.

12. A non-transitory computer-readable recording medium storing a program that causes, by a computer, a substrate processing apparatus which includes: a process chamber including an exhaust part configured to exhaust an internal atmosphere of the process chamber and a gate valve that opens and closes a loading and unloading port configured to load and unload a substrate, and configured to heat and process the substrate by a heater using a microwave; a substrate transfer chamber including a purge gas distribution mechanism configured to distribute a purge gas supplied from a clean unit capable of introducing the purge gas, a transfer machine installed inside the substrate transfer chamber and configured to transfer the substrate into the process chamber; a substrate cooling mounting tool configured to cool the substrate transferred from the process chamber by the transfer machine; and a controller configured to control an exhaust amount of the exhaust part, to perform a process comprising:

transferring the substrate into the process chamber;

performing a predetermined modifying process by heating the substrate;

controlling, by the controller, the exhaust amount of the exhaust part, while opening the gate valve after performing the predetermined modifying process, such that a portion of the purge gas supplied from the clean unit into the substrate transfer chamber flows into the process chamber; and cooling the substrate after the modifying process by mounting the substrate on the substrate cooling mounting tool by the transfer machine.

* * * * *